(12) United States Patent
Yanagida et al.

(10) Patent No.: US 9,293,421 B2
(45) Date of Patent: Mar. 22, 2016

(54) ELECTRONIC COMPONENT MODULE

(71) Applicant: TDK CORPORATION, Tokyo (JP)

(72) Inventors: Miyuki Yanagida, Tokyo (JP); Makoto Orikasa, Tokyo (JP); Susumu Taniguchi, Tokyo (JP); Hisayuki Abe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/591,427

(22) Filed: Jan. 7, 2015

(65) Prior Publication Data

US 2015/0255401 A1 Sep. 10, 2015

Related U.S. Application Data

(60) Provisional application No. 61/948,725, filed on Mar. 6, 2014.

(51) Int. Cl.
*H01L 23/552* (2006.01)
*H01L 23/31* (2006.01)

(52) U.S. Cl.
CPC .......... *H01L 23/552* (2013.01); *H01L 23/3114* (2013.01); *H01L 2224/32225* (2013.01); *H01L 2224/48091* (2013.01); *H01L 2224/48227* (2013.01); *H01L 2224/73265* (2013.01); *H01L 2225/06537* (2013.01); *H01L 2924/3025* (2013.01)

(58) Field of Classification Search
CPC ..................... H01L 23/552; H01L 2924/3025; H01L 2225/06537
See application file for complete search history.

(56) References Cited

U.S. PATENT DOCUMENTS

| | | | |
|---|---|---|---|
| 6,740,411 B2 * | 5/2004 | Kojima et al. | 428/413 |
| 2012/0187585 A1 | 7/2012 | Yamazaki | |
| 2013/0082368 A1 | 4/2013 | Kim et al. | |

FOREIGN PATENT DOCUMENTS

| | | |
|---|---|---|
| JP | 2012-151326 | 8/2012 |
| JP | 2013-80926 | 5/2013 |

\* cited by examiner

*Primary Examiner* — Phat X Cao
(74) *Attorney, Agent, or Firm* — Greenblum & Bernstein, P.L.C.

(57) ABSTRACT

An electronic component module according to the present invention is provided with an electronic component, a sealing resin that seals the electronic component, and a metal film that covers a surface of the sealing resin. The sealing resin contains filler of oxide particles. Part of the filler in the sealing resin is exposed to the surface of the sealing resin. At least the part of the filler exposed to the surface of the sealing resin includes a crack that extends from an exposed surface of the filler into an inner portion. The crack is filled with at least one metal that constitutes the metal film.

6 Claims, 4 Drawing Sheets

ELECTRONIC COMPONENT MODULE

CLAIM FOR PRIORITY

This application claims the priority benefit of U.S. provisional application 61/948,725, filed Mar. 6, 2014, the contents of which is expressly incorporated by reference herein in their entireties.

BACKGROUND OF THE INVENTION

1. Technical Field

The present invention relates to an electronic component module, and particularly to an electromagnetic wave shielding structure of an electronic component module.

2. Description of Related Art

With the aim of preventing the leak of electromagnetic wave noise from an electronic component such as a semiconductor chip and preventing the intrusion of electromagnetic wave noise from a surrounding environment, the periphery of the electronic component has been covered with an electromagnetic wave shield made of metal film. In recent years, the electronic components have been required to be smaller in size and have a higher performance. As a result, the electromagnetic wave shields, too, are required to be made smaller in size and have a high performance.

For example, an electronic component shielding method disclosed in Japanese Patent Application Laid-Open No. 2012-151326 includes: a step of sealing a semiconductor device mounted on a substrate with a sealing resin containing a filler; a step of shaving a surface of the sealing resin to expose a part of the filler; a step of carrying out etching of the exposed filler to make a hole on the surface of the sealing resin; and a step of forming a metal film on the surface of the sealing resin including an inner surface of the hole. This shielding method improves the anchor effect of the metal film, leading to an improvement in the adhesion of the metal film to the surface of the sealing resin. Moreover, the metal film that serves as the electromagnetic shielding layer is directly formed on the surface of the sealing resin. Therefore, the entire semiconductor device, including the electromagnetic shield, can be made smaller in size than when the entire component is covered with a metal plate.

Japanese Patent Application Laid-Open No. 2013-080926 discloses a substrate module that includes an EMI (Electro Magnetic Interference) shielding layer. The substrate module includes a semiconductor package and an EMI shielding layer formed at least in one portion of the surface of the semiconductor package. The EMI shielding layer contains a matrix layer, a metal layer disposed in an upper portion of the matrix layer, and first seed particles disposed at an interface between the matrix layer and the metal layer. The substrate module can be extended in such a way as to allow a conventional shielding step, which has been conducted on a per-device basis, to be carried out at the level of the mounting substrate. Therefore, the module can be produced inexpensively and with high productivity in a short period of time.

However, the problem with the above-described conventional electromagnetic wave shielding structure is that the adhesion of the metal film to the electronic component is weak, and the durability (humidity resistance) thereof is low.

For example, as shown in FIGS. 4 and 5 of Japanese Patent Application Laid-Open No. 2012-151326, if a difference in level is generated on the surface of the sealing resin and on an inner surface of a hole formed on the surface of the sealing resin, the amount of plating solution that goes around to a surface of the inner surface of the hole may be insufficient during an electroless plating process, and the plating may not adhere thereto. Therefore, the problem is that a sufficient electromagnetic shielding performance cannot be obtained, and the durability is low. Moreover, since the unevenness of the inner surface of the hole is large, a water washing process that comes after the electroless plating process could be often insufficient; the plating solution remaining on the inner surface of the hole could lead to a decrease in reliability.

SUMMARY OF THE INVENTION

The object of the present invention is to provide an electronic component module that is excellent in durability, with a metal film, which gives an electromagnetic wave shielding effect, having strong adhesion to a sealing resin.

To solve the above problems, an electronic component module of the present invention includes: an electronic component; a sealing resin that seals the electronic component; and a metal film that covers a surface of the sealing resin, wherein the sealing resin contains filler of oxide particles, part of the filler in the sealing resin is exposed to the surface of the sealing resin, at least the part of the filler exposed to the surface of the sealing resin includes a crack that extends from an exposed surface of the filler into an inner portion, and the crack is filled with at least one metal that constitutes the metal film.

According to the present invention, it is possible to provide an electronic component module whose metal film has strong adhesion to the sealing resin and which is excellent in durability and electromagnetic wave shielding performance.

In the present invention, it is preferable that the metal film includes a first metal film that is formed on a surface of the sealing resin and is made mainly of Cu, and a second metal film that is formed on a surface of the first metal film and is made mainly of Ni, and the crack is filled with part of the first metal film.

In the present invention, it is preferable that the first metal film further contains at least one metal that is selected from among a group of Ni, Co, and Fe. Therefore, the stress of the first metal film can be reduced, leading to an improvement in the metal film's adhesion to the sealing resin. As a result, it is possible to provide an electronic component module that is even better in durability.

In the present invention, it is preferable that the first metal film is 0.5 μm to 3.5 μm in thickness. In this case, it is possible to obtain an electronic component module whose metal film has stronger adhesion to the sealing resin and which is better in the electromagnetic wave shielding performance.

According to the present invention, it is preferable that the second metal film is 0.5 μm to 3.0 μm in thickness. In this case, it is possible to obtain an electronic component module whose metal film has stronger adhesion to the sealing resin and which is better in the durability.

In the present invention, it is preferable that a ratio in thickness of an upper surface portion of the metal film that covers an upper surface of the sealing resin to a side surface portion of the metal film that covers a side surface of the sealing resin is preferably greater than or equal to 1.0 and less than or equal to 2.5. In this case, it is possible to obtain an electronic component module which is better in the durability.

In the present invention, it is preferable that an exposed surface of the filler is substantially flush with a surface of the sealing resin. In this case, it is possible to increase the uniformity of the metal film that covers the surface of the sealing resin, as well as the metal film's adhesion to the sealing resin and the durability.

According to the present invention, it is possible to provide an electronic component module that is excellent in the durability, with the metal film, which gives an electromagnetic wave shielding effect, having strong adhesion to the sealing resin.

DETAILED DESCRIPTION OF THE EMBODIMENTS

Preferred embodiment of the present invention will be described hereinafter in detail with reference to the accompanying drawings.

Figure 1:
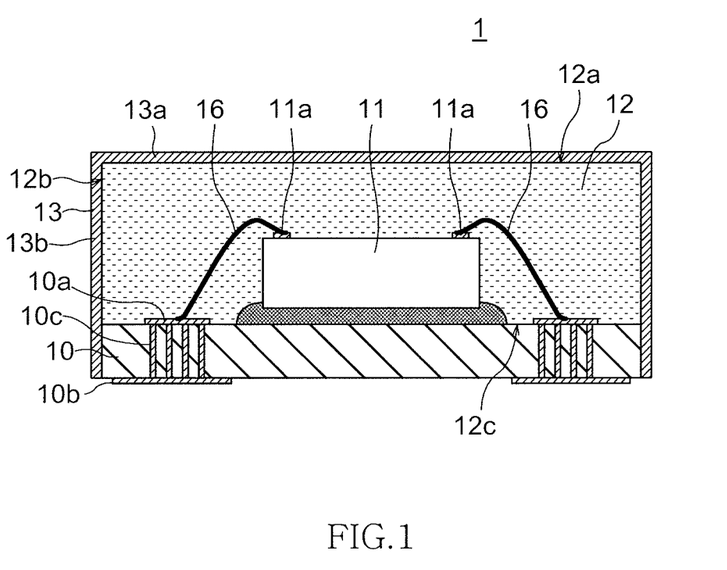
FIG. 1 is a schematic cross-sectional view showing the configuration of an electronic component module according to a preferred embodiment of the present invention.

FIG. 1 is a schematic cross-sectional view showing the configuration of an electronic component module according to a preferred embodiment of the present invention.

As shown in FIG. 1, the electronic component module 1 includes a mounting substrate 10; an electronic component 11, which is mounted on the mounting substrate 10; a sealing resin (mold resin) 12, which is used to seal the electronic component 11; and a metal film 13, which covers an exposed surface of the sealing resin 12.

The mounting substrate 10 is a printed wiring board that is made by forming wiring patterns 10a and 10b on top and back surfaces of an insulating substrate. The insulating substrate may be a glass epoxy sheet such as FR4 (Flame Retardant Type 4), for example, or may be a ceramic substrate such as alumina, SiC, or aluminum nitride. In this manner, the insulating substrate is not specifically limited. The mounting substrate 10 includes through-hole conductors 10c, which pass through the insulating substrate and connect the wiring patterns 10a and 10b. The wiring patterns 10b on the back surface of the mounting substrate 10 are electrically connected to pad electrodes 11a of the electronic component 11 via the through-hole conductors 10c and bonding wires 16.

A semiconductor IC chip is among the typical electronic components 11. The electronic component 11 is mounted on the mounting substrate 10 by soldering. The pad electrodes 11a of the electronic component 11 are connected to the wiring patterns 10a via the bonding wires 16. The electronic component 11 may be a discrete component such as a chip capacitor or a chip inductor.

The sealing resin 12 works to protect the electronic component 11 against external stress, moisture, pollutants, and the like. The sealing resin 12 may be made of epoxy resin. The sealing resin 12 contains a filler (filling material) made of oxide particles, thereby reducing the thermal expansion coefficient and improving the thermal conductivity.

The metal film 13 works as an electromagnetic wave shield to block an electromagnetic field noise that enters the electronic component 11 and an electromagnetic field noise radiated from the electronic component 11. The metal film 13 covers the surface of the sealing resin 12. In this case, the surface of the sealing resin 12 is an exposed surface of the sealing resin 12 at a time when the metal film 13 has yet to be formed; the surface of the sealing resin 12 includes an upper surface 12a of the sealing resin 12, which is located on the opposite side of the sealing resin 12 from a surface on which the electronic component 11 is mounted (or an upper surface of the mounting substrate 10), and four side surfaces 12b of the sealing resin 12, which are perpendicular to the mounting surface. The metal film 13 is formed across the entire exposed surface of the sealing resin 12, or is formed not only on the upper surface 12a of the sealing resin 12 but also on the side surfaces 12b, thereby increasing the shielding effect.

It is preferred that an upper surface portion 13a of the metal film 13 that covers the upper surface 12a of the sealing resin 12 be 1.0 to 2.5 times greater in thickness than side surface portions 13b of the metal film 13 that cover the side surfaces 12b of the sealing resin 12. That is, the ratio in thickness of the upper surface portion 13a to the side surface portions 13b of the metal film 13 is preferably greater than or equal to 1.0 and less than or equal to 2.5. This configuration makes it difficult for the metal film 13 to peel off from the sealing resin 72. Moreover, this configuration can increase the durability of the metal film 13.

Figure 2A:
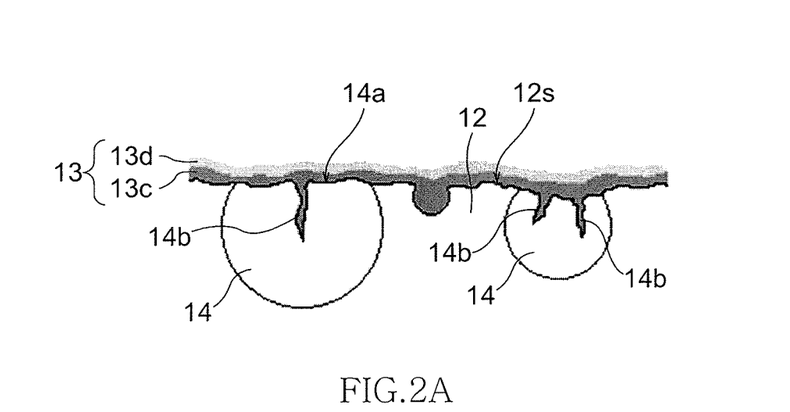
FIG. 2A is a schematic cross-sectional view showing the configuration of an interface between the sealing resin 12 and the metal film 13 according to the embodiment.
Figure 2B:
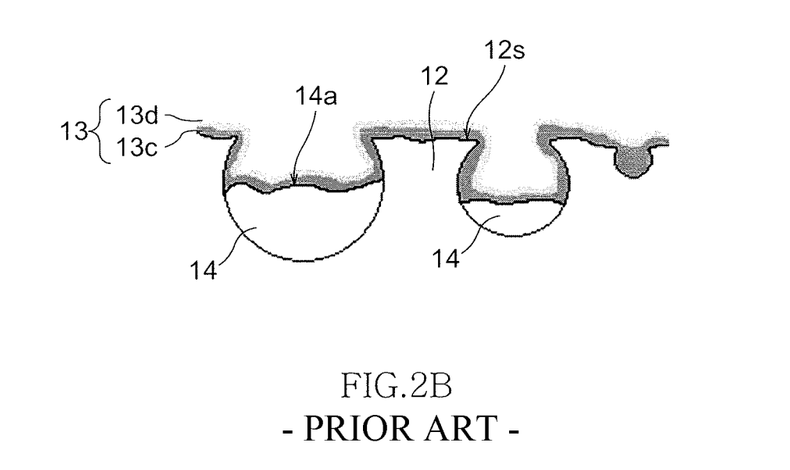
FIG. 2B is a schematic cross-sectional view showing the conventional configuration of an interface between a sealing resin 12 and a metal film 13.

FIG. 2A is a schematic cross-sectional view showing the configuration of an interface between the sealing resin 12 and the metal film 13 according to the embodiment. FIG. 2B is a schematic cross-sectional view showing the conventional configuration of an interface between a sealing resin 12 and a metal film 13.

As shown in FIG. 2A, the sealing resin 12 contains a filler 14 made of oxide particles such as spherical fused silica powder ($SiO_2$). Part of the filler 14 is exposed to a surface 12s of the sealing resin 12. As described above, the surface 12s of the sealing resin 12 includes the upper surface 12a and side surfaces 12b of the sealing resin 12 except for a lower surface 12c of the sealing resin 12 that faces the mounting substrate 10 and is in close contact with the mounting substrate 10.

The surface 12s of the sealing resin 12 to which the filler 14 is exposed is covered with the metal film 13. The metal film 13 has a two-layer structure, and includes a first metal film 13c, which is mainly made of Cu (copper), and a second metal film 13d, which is mainly made of Ni (nickel); the first metal film 13c and the second metal film 12d are stacked in this order. Cu is high in electrical conductivity, and is advantageous in terms of workability and cost. Therefore, Cu is suitable as the material of the electromagnetic wave shield. The Ni film functions as an anti-oxidation film for the Cu film.

The first metal film 13c may be an alloy film that is made mainly of Cu. In this case, the alloy film preferably further contains at least one metal that is selected from among a group of Ni, Co, and Fe. If the metal film mainly made of Cu further contains at least one of those metals, the stress of the metal film 13 can be reduced.

The second metal film 13d preferably contains P (phosphorus). The concentration of P is preferably 2 to 19 atomic percent. Within this range, the metal film that is excellent in corrosion resistance and abrasive resistance can be obtained.

It is preferred that the first metal film 13c be 0.5 to 3.5 μm in thickness. If the thickness is less than 0.5 μm, a sufficient electromagnetic wave shielding effect cannot be obtained. If the thickness is greater than 3.5 μm, the first metal film 13c lacks sufficient adhesion to the sealing resin.

It is preferred that the second metal film 13d be 0.5 to 3.0 μm in thickness. If the thickness is less than 0.5 μm, the second metal film 13d does not have a sufficient antioxidant effect and is insufficient in durability. If the thickness is greater than 3.0 μm, the second metal film 13d lacks sufficient adhesion to the sealing resin.

The height of an exposed surface 14a of the filler 14 is almost equal to the height of the surface 12s of the sealing resin 12. Accordingly, the unevenness of the surface 12s of the sealing resin 12, including the exposed surface 14a of the filler 14, is very small, resulting in an increase in the adhesion of the metal film 13 to the sealing resin and in the durability.

The waviness (arithmetic mean waviness Wa) of the metal film 13 is preferably less than or equal to 5 μm. As described above, the height of the exposed surface 14a of the filler 14 is almost equal to the height of the surface 12s of the sealing resin 12. As a result, the surface of the metal film 13 that is formed on the surface 12s of the sealing resin 12, including the exposed surface 14a of the filler 14, is very smooth.

In the filler 14 that is exposed to the surface 12s of the sealing resin 12, cracks 14b are formed in such a way as to extend from the exposed surface 14a into the inner portion thereof. The inner portions of the cracks 14b are filled with metal. The composition of the metal is the same as that of the first metal film 13c: The metal does not contain P. That is, the inner portions of the cracks 14b are filled with part of the first metal film 13c covering the surface 12s of the sealing resin 12. Since the filler 14 has the cracks 14b, the adhesion of the metal film 13 can be improved due to the anchor effect of the cracks 14b. Accordingly, it is preferred that the amount of the filler 14 contained should be as high as possible. More specifically, the amount is preferably greater than or equal to 60 percent by mass.

Incidentally, it is desirable that the cracks 14b be formed in as many pieces of filler 14 as possible that are exposed to the surface 12s of the sealing resin 12. However, there is no need for the cracks 14b to be formed in all pieces of filler 14, as long as the cracks 14b are formed in at least some pieces of filler 14 that are exposed to the surface 12s of the sealing resin 12.

As shown in FIG. 2B, in the case of the conventional structure of an interface between a sealing resin 12 and a metal film 13, the height of an exposed surface 14a of a filler 14 is smaller than the height of a surface 12s of a sealing resin 12. If a hole is formed on the surface 12s of the sealing resin 12, it is difficult to evenly form first and second metal films 13c and 13d, because the flatness of the surface 12s of the sealing resin 12, including the exposed surface 14a of the filler 14, is poor. Therefore, it is difficult to form the metal film 13 into every corner of the inner portion of the hole. Moreover, the filler 14 does not have any cracks 14b. Therefore, the adhesion and durability of the metal film 13 is insufficient.

As shown in FIG. 2A, if the height of the exposed surface 14a of the filler 14 is almost equal to the height of the surface 12s of the sealing resin 12, the flatness of the surface 12s of the sealing resin 12, including the exposed surface 14a of the filler 14, can be increased. Therefore, the first and second metal films 13c and 13d can be evenly formed. Furthermore, since the filler 14 has cracks 14b, the anchor effect can be improved. Therefore, the adhesion and durability of the metal film 13 can be improved.

Figure 3:
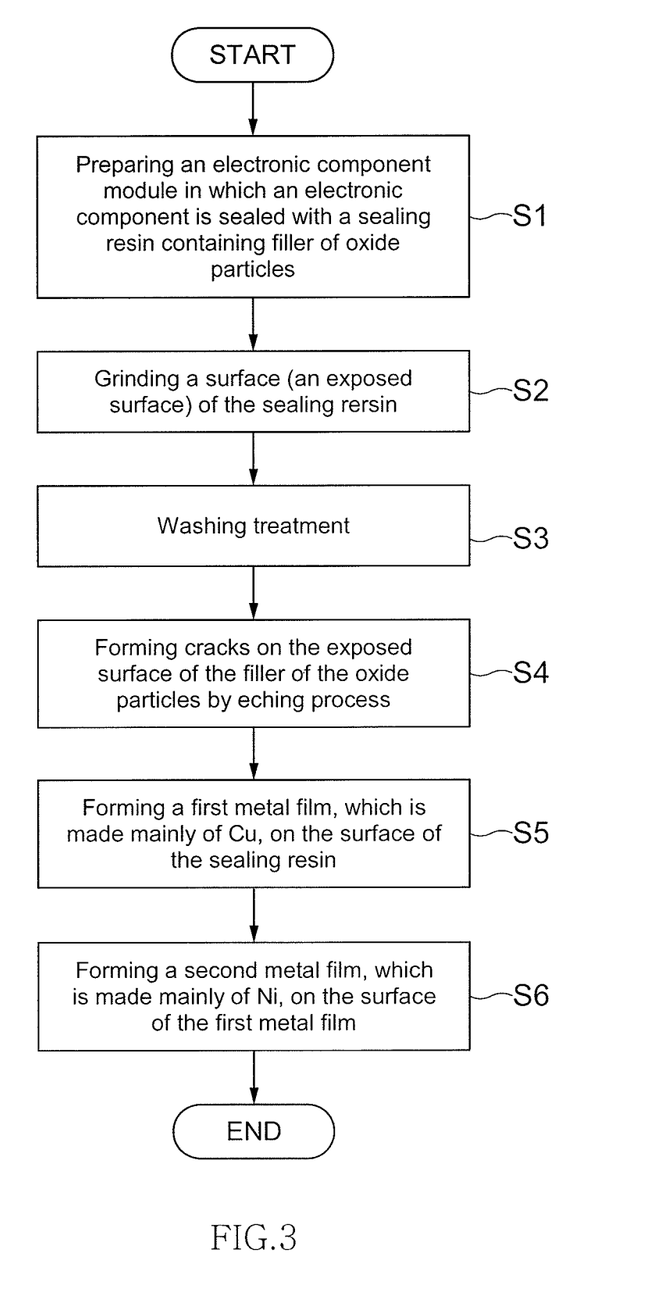
FIG. 3 is a flowchart illustrating a method of producing the electronic component module 1.

FIG. 3 is a flowchart illustrating a method of producing the electronic component module 1.

As shown in FIG. 3, during the production of the electronic component module 1, first the electronic component module 1 is prepared as an intermediate product by mounting the electronic component 11 on the mounting substrate 10, and then sealing the electronic component 11 with the sealing resin containing the filler 14 (Step S1).

Then, the burr of the sealing resin 12 is removed, and a process of thinly grinding the surface (exposed surface) of the sealing resin 12, which will become a surface on which the metal film 13 is formed, is carried out (Step S2). This process is preferably carried out by blasting, or particularly by wet blasting. Alternatively, this process may be carried out by a method of pressing a brush against the surface of the sealing resin while moving the brush back and forth, or may be carried out by a method of using a whetstone or the like. Before the grinding process, a masking tape may be put on the back surface of the electronic component module to cover the wiring patterns 10b formed on the back surface of the mounting substrate 10.

In the wet blasting, a mixed solution (slurry) of a liquid, such as water, and abrasives is sprayed on the exposed surface of the sealing resin 12; as the abrasives strike the exposed surface, the surface of the sealing resin 12 is thinly removed (e.g., about 30 μm). When still being in the state of being molded, a surface portion of the sealing resin 12 contains a large amount of resin components, and many more pieces of filler exist in the inner portion than in the surface portion. As the surface portion of the sealing resin is thinly removed, some of the oxide particles contained in the sealing resin 12 are exposed.

After the grinding process, the electronic component module 1 is washed with pure water and is degreased (Step S3). This cleaning process can remove stains (dust, oil, and the like) adhering to the surface of the sealing resin 12, thereby increasing the adhesion of the metal film. Moreover, this process helps to prevent the metal film from being attached to an unnecessary location, thereby avoiding a short circuit (short) between the wiring patterns 10b.

Then, the electronic component module 1 is washed with pure water and dried. After that, the electronic component module 1 is left in a container containing an etching solution for a while to etch the surface of the sealing resin 12 (Step S4). This etching process forms cracks 14b on the exposed surface 14a of the filler 14.

Then, the first metal film 13c, which is made mainly of Cu, is formed on the surface of the sealing resin 12 (Step S5). Furthermore, the second metal film 13d, which is made mainly of Ni, is formed on the surface of the first metal film 13c (Step S6). The method of forming the first and second metal films 13c and 13d are not specifically limited; an electroless plating method, a sputtering method, a printing method, or the like may be used. If the electroless plating method is used to form the first metal film 13c, the surface of the sealing resin 12 is preferably treated with a 10% sulfate aqueous solution, and a catalytic metal that serves as a core of the electroless plating is put in advance on the surface of the sealing resin 12, in order to increase the adhesion of the first metal film 13c. For example, the catalytic metal may be a Pd—Sn complex. In that manner, the electronic component module 1 in which the exposed surface of the sealing resin 12 is covered with the metal film 13 is completed.

As described above, in the electronic component module 1 of the present embodiment, the sealing resin 12, which is used to seal the electronic component 11, contains the filler 14 of oxide particles. The filler 14 is exposed to the surface of the sealing resin 12. The filler 14 includes cracks 14b. The cracks 14b are filled with part of the first metal film 13c, which is part of the metal film 13. Therefore, it is possible to realize the electronic component module whose metal film 13 has strong adhesion to the sealing resin 12 and which is excellent in durability and electromagnetic wave shielding performance.

Although the preferable embodiment of the invention has been described above, it is needless to say that the invention is by no means restricted to the embodiment and can be embodied in various modes within the scope which does not depart from the gist of the invention.

EXAMPLES

A sample of an electronic component module in which an electronic component was mounted on a mounting substrate and the electronic component was sealed with a sealing resin (mold resin) that contained silica filler was prepared as an intermediate product. As the mounting substrate, a resin printed wiring board of FR4 (Flame Retardant Type4) was used.

Next, the grinding of the sealing resin was carried out. In the grinding process, the back surface of the electronic component module (or the back surface of the mounting substrate) was covered with a masking tape, and then the back side of the electronic component module was attached to a surface of a glass plate with an adhesive sheet. Then, the surface of the sealing resin of the electronic component module was ground by wet blasting. After the grinding process, the electronic component module was washed with pure water, and was immersed in a degreasing solution for five minutes to remove stains and the like adhering to the surface of the sealing resin.

Then, the surface of the sealing resin was etched. In the etching process, the electronic component module was first immersed in a degreasing solution for five minutes, and was washed with pure water. Next, the electronic component module was immersed in a 20 g/L aqueous solution of ammonium fluoride for five minutes, and was washed with pure water.

Next, the metal film was formed by electroless plating method. In the electroless plating process, the electronic component module was immersed in an aqueous solution containing colloid of Sn and Pd for five minutes, and was washed with pure water. Then, the electronic component module was immersed in an electroless Cu plating solution for 50 minutes, and was washed with pure water. As a result, a Cu film with a thickness of 1.9 μm was obtained.

Next, the electronic component module was immersed in an aqueous solution containing Pd ions for five minutes, and was washed with pure water. Then, the electronic component module was immersed in an electroless Ni plating solution for 10 minutes, and was washed with pure water. As a result, a Ni film with a thickness of 1.9 μm was obtained. Finally, the electronic component module was dried at 90° C. for one hour. As a result, Sample #1 (Example 1) of the electronic component module was completed.

As for Sample #1 of the electronic component module, after the etching, the exposed surface of the sealing resin was observed under a scanning electron microscope (SEM); oxide particles contained in the sealing resin were exposed, and cracks were formed in the exposed oxide particles. After the formation of the metal film, the cross sections of the cracks in the oxide particles were observed under SEM; the cracks were filled with metal.

Sample #2 of the electronic component module was produced in the same manner as in Example 1. After the etching, the exposed surface of the sealing resin was observed under SEM. It was found that oxide particles contained in the sealing resin were not exposed. Sample #2 of the electronic component module is also referred to as Comparative Example 1.

Sample #3 of the electronic component module was produced in the same manner as in Example 1. After the etching, the exposed surface of the sealing resin was observed under SEM. It was found that oxide particles contained in the sealing resin were exposed, but no cracks were formed in the exposed oxide particles. Sample #3 of the electronic component module is also referred to as Comparative Example 2.

Sample #4 of the electronic component module was produced in the same manner as in Example 1. After the etching, the exposed surface of the sealing resin was observed under SEM. It was found that oxide particles contained in the sealing resin were exposed, and cracks were formed in the exposed oxide particles. However, after the formation of the metal film, the cross sections of the cracks in the oxide particles were observed under SEM, and it was found that the cracks were not filled with the metal. Sample #4 of the electronic component module is also referred to as Comparative Example 3.

For Samples #1 to #4 (Example 1 and Comparative Examples 1 to 3) of the electronic component modules, a "cross-cut test", a "PCT test", and an "EMI test" were conducted.

(Cross-Cut Test)

In accordance with JIS K5600-5-6, a cross-cut test was conducted to examine the adhesion of the metal film, which was formed on the surface of the sealing resin, to the sealing resin.

In the cross-cut test, a blade was first put on the surface of the metal film in such a way as to be perpendicular to the surface of the metal film. Six cuts were made in such a way as to pass through the metal film and reach the surface of the sealing resin. Then, the direction was changed by 90 degrees, and six cuts were made in such a way as to be perpendicular to the cuts already formed. Next, a piece of cellophane tape that was 25 mm wide and 75 mm long was firmly attached to the cut portions of the metal film. About three minutes later, the piece of cellophane tape was peeled off at an angle of around 60 degrees over the course of 0.5 to 1.0 second.

After the cellophane tape was peeled off, the state of the surface of the metal film was visually checked. The adhesion (peeled-off state) of the metal film to the sealing resin was assessed on a scale of 1 to 5 as described below.

The "1" on the scale of 1 to 5 means that a small portion of the metal film came off at the intersection of cuts (the rate of peeling is less than 5%). The "2" means that the metal film came off along an edge of a cut and/or at the intersection of cuts (the rate of peeling is about 5% to 15%). The "3" means that a large piece of the metal film partially or completely came off along an edge of a cut, and/or that the metal film partially or completely came off in various locations of squares (the rate of peeling is about 15% to 35%). The "4" means that a large piece of the metal film partially or completely came off along an edge of a cut, and/or that the metal film partially or completely came off at several squares (the rate of peeling is about 35% to 65%). The "5" means that an even larger piece of the metal film came off than that of the "4". The metal film ranked as "1" or "2" was judged to be excellent in adhesion. The metal film ranked as "3", "4", or "5" was judged to be poor in adhesion.

(PCT Test)

A PCT test was conducted to check the durability of the metal film on the surface of the sealing resin. In the PCT test, the samples of the electronic component modules were put into a thermostatic chamber (pressure cooker chamber) in which the temperature was 120° C., the relative humidity was 85% RH, and the pressure was $1.7 \times 10^5$ Pa. 48 hours later and 96 hours later, whether or not the metal film had come off was checked.

In the assessment of the samples, a sample in which the metal film did not come off 48 hours after the start of the test but did come off 96 hours later was ranked as "B", as the durability of the metal film was good. A sample in which the metal film did not come off even 96 hours later was ranked as "A", as the durability of the metal film was better. A sample in which the metal film came off 48 hours later was ranked as "C", as the durability was poor.

(EMI Test)

Figure 4:
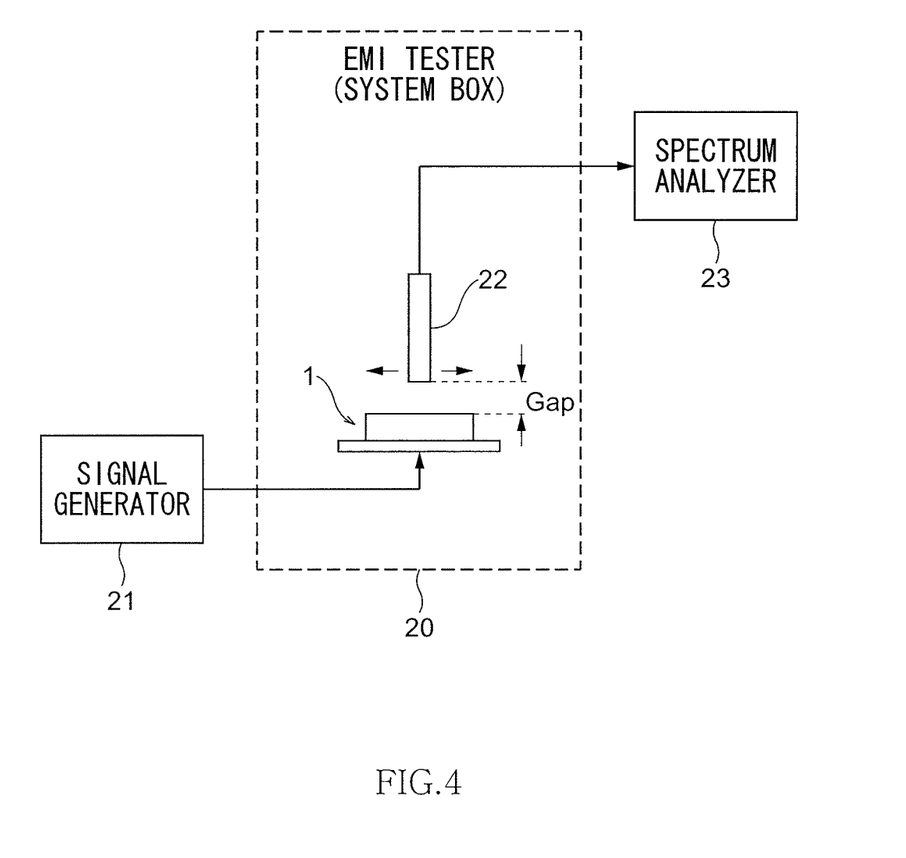
FIG. 4 is a block diagram of a measurement system for an EMI test.

A measurement system shown in FIG. 4 was used to carry out an EMI test. As a near electromagnetic field measurement device 20, an EMI tester (EMV-200) manufactured by Yashima Denki Co., Ltd. was used. The frequency of a test signal of a signal generator 21 was set to 500 MHz, and the output level was set to 117 dBμV. While the test signal was being applied to the samples of the electronic component modules 1, a probe 22 was swept across the surfaces of the samples, and the peak power of the noise radiated from the samples was detected by a spectrum analyzer 23.

In the assessment of the electromagnetic wave shielding performance, a peak value of the radiated noise of an electronic component module with no metal film formed was measured as a reference; the value was 80.7 dBμV. Therefore, in the assessment of the samples, if the peak value of the radiated noise was less than or equal to 50 dBμV, the samples were classified as "B", as the electromagnetic wave shielding performance was good. If the peak value of the radiated noise was less than or equal to 40 dBμV, the samples were classified as "A", as the electromagnetic wave shielding performance was better. If the peak value of the noise was greater than 50 dBμV, the samples were classified as "C", as the electromagnetic wave shielding performance was poor.

(Judgment)

A sample that was classified as "1" in the cross-cut test and as "A" in both the PCT and EMI tests was ranked as "A", as the sample was better. A sample that was classified as "1" or "2" in the cross-cut test and as "A" or "B" in the PCT and EMI tests was ranked as "B", as the sample was good. A sample that was classified as "3" to "5" in the cross-cut test or as "C" in either the PCT or EMI test was ranked as "C", as the sample was poor. Table 1 shows the results of the tests on Samples #1 to #4 of the electronic component modules of Example 1 and Comparative Examples 1 to 3.

TABLE 1

| SAMPLE | Oxide particles in the sealing resin | | | Metal film on a surface opposed to the mounting surface | | Evaluation | | | |
|---|---|---|---|---|---|---|---|---|---|
| | Exposition | Crack | Metal in the Clack | Cu Thickness | Ni Thickness | Cross cut Test | PCT Test | EMI Test | Judgment |
| Comparative Example 1 | N | — | — | 1.9 μm | 2.0 μm | 5 | C | A | C |
| Comparative Example 2 | Y | N | — | 2.1 μm | 2.0 μm | 4 | C | A | C |
| Comparative Example 3 | Y | Y | N | 2.1 μm | 1.9 μm | 3 | C | A | C |
| Example 1 | Y | Y | Y | 1.9 μm | 1.9 μm | 2 | B | A | B |

*[Y]: Presence, [N]: Absence

As can be seen from Table 1, only Sample #1 (Example 1), in which cracks were formed in the exposed oxide particles with the cracks being filled with the metal, was ranked as "B". The other samples were ranked as "C". In this manner, it was found that only the metal film of Sample #1 had good adhesion to the sealing resin.

Samples #5 to #7 of the electronic component modules were prepared in the same manner as in Example 1. A process of grinding the sealing resin by blasting and a process of etching the exposed surface of the sealing resin were carried out. Then, the cross section (ground surface) of the sealing resin was observed under a stereomicroscope; oxide particles contained in the sealing resin were exposed, and cracks were formed in the exposed oxide particles. Samples #5 to #7 are also referred to as Examples 2 to 4. The maximum depths of the cracks in the oxide particles of Examples 2 to 4 and Example 1 were measured. The samples whose cracks had different maximum depths were assessed. Table 2 shows the results.

TABLE 2

| SAMPLE | Oxide particles in the sealing resin Crack (Crack Depth) | Oxide particles in the sealing resin Metal in the Clack | Metal film on a surface opposed to the mounting surface Cu group Composition | Metal film on a surface opposed to the mounting surface Cu group Thickness | Metal film on a surface opposed to the mounting surface Ni Thickness | Evaluation Cross cut Test | Evaluation PCT Test | Evaluation EMI Test | Judgment |
|---|---|---|---|---|---|---|---|---|---|
| Example 2 | Y (2.7 µm) | Y | Cu | 1.9 µm | 2.1 µm | 2 | B | A | B |
| Example 3 | Y (3.0 µm) | Y | Cu | 1.9 µm | 2.0 µm | 9 | B | A | B |
| Example 1 | Y (8.1 µm) | Y | Cu | 1.9 µm | 1.9 µm | 9 | B | A | B |
| Example 4 | Y (10.3 µm) | Y | Cu | 1.9 µm | 1.9 µm | 1 | B | A | B |

*[Y]: Presence, [N]: Absence

As can be seen from Table 2, Sample #7 (Example 4) whose cracks had a largest maximum depth of 10.3 µm was ranked as "1", which means that Sample #7 earned a good mark on the cross-cut test. Given the above results, it was found that, as the maximum depths of the cracks become larger, the metal films have better adhesion to the sealing resin.

Samples #8 to #11 (Examples 5 to 8) of intermediate products of the electronic component modules were prepared in the same manner as in Example 1. A study was conducted on how a difference in the pressure of spraying abrasives would affect the maximum depths of cracks in the oxide particles at a time when the sealing resin was ground by the blasting method. Table 3 shows the results.

TABLE 3

| SAMPLE | Condition for exposing Oxide particles in the sealing resin method | Condition for exposing Oxide particles in the sealing resin Diameter of abrasives | Condition for exposing Oxide particles in the sealing resin pressure | Oxide particles in the sealing resin Crack | Oxide particles in the sealing resin Crack Depth |
|---|---|---|---|---|---|
| Example 5 | blasting | #400 | 1 kgf/cm³ | Y | 2.9 µm |
| Example 6 | blasting | #400 | 3 kgf/cm³ | Y | 6.9 µm |
| Example 7 | blasting | #400 | 5 kgf/cm³ | Y | 10.4 µm |
| Example 8 | blasting | #400 | 7 kgf/cm³ | Y | 15.3 µm |

*[Y]: Presence, [N]: Absence

As can be seen from Table 3, it was found that, as the pressure of spraying abrasives becomes larger in the blasting process, the maximum depths of the cracks increase.

Samples #12 to #15 (Examples 9 to 12) of intermediate products of the electronic component modules were prepared in the same manner as in Example 1. A study was conducted on how a difference in the time during which the electronic component module was immersed in an aqueous solution of ammonium fluoride during the etching process following the grinding of the sealing resin would affect the maximum depths of cracks of the oxide particles. Table 4 shows the results.

TABLE 4

| SAMPLE | Condition for etching Oxide particles Reagent | Condition for etching Oxide particles concentration | Condition for etching Oxide particles time | Oxide particles in the sealing resin Crack | Oxide particles in the sealing resin Crack Depth |
|---|---|---|---|---|---|
| Example 9 | ammonium fluoride | 20 g/L | 3 h | Y | 3.3 µm |
| Example 10 | ammonium fluoride | 20 g/L | 8 h | Y | 6.1 µm |
| Example 11 | ammonium fluoride | 20 g/L | 15 h | Y | 10.3 µm |
| Example 12 | ammonium fluoride | 20 g/L | 25 h | Y | 12.6 µm |

*[Y]: Presence, [N]: Absence

As can be seen from Table 4, it was found that, the longer the electronic component module is immersed in an aqueous solution of ammonium fluoride, the larger the maximum depths of the cracks become.

Samples #16 to #18 (Examples 13 to 15) of the electronic component modules were prepared; Samples #16 to #18 had the same configuration as that of Example 1 except that the composition of the first metal film containing Cu was different. The samples were assessed in the same way as in Example 1. In this case, the metal film of Example 1 was made only of Cu. The metal film of Example 13 was an alloy film made of Cu and Ni. The metal film of Example 14 was an alloy film made of Cu and Co. The metal film of Example 15 was an alloy film made of Cu and Fe. Table 5 shows the results.

TABLE 5

| SAMPLE | Oxide particles in the sealing resin | | Metal film on a surface opposed to the mounting surface | | | Evaluation | | | |
|---|---|---|---|---|---|---|---|---|---|
| | Crack (Crack Depth) | Metal in the Clack | Cu group | | Ni | Cross cut Test | PCT Test | EMI Test | Judg- ment |
| | | | Composition | Thick- ness | Thick- ness | | | | |
| Example 1 | Y (8.1 μm) | Y | Cu | 1.9 μm | 1.9 μm | 2 | B | A | B |
| Example 13 | Y (6.7 μm) | Y | Cu—Ni | 1.9 μm | 1.9 μm | 1 | A | A | A |
| Example 14 | Y (9.1 μm) | Y | Cu—Co | 1.9 μm | 2.0 μm | 1 | A | A | A |
| Example 15 | Y (7.1 μm) | Y | Cu—Fe | 2.1 μm | 1.9 μm | 1 | B | A | A |

*[Y]: Presence, [N]: Absence

As can be seen from Table 5, it was found that Samples #16 to #18 (Examples 13 to 15) whose first metal films further contained one metal element, Ni, Co, or Fe, were better in the metal film's adhesion to the sealing resin and the durability (PCT resistance), compared with Sample #1 (Example 1).

Samples #19 to #23 (Examples 16 to 20) of the electronic component modules were prepared; Samples #19 to #23 had the same configuration as that of Example 1 except that the first metal films were an alloy film made of Cu and Ni and were different in thickness. The samples were assessed in the same way as in Example 1. Table 6 shows the results.

thickness were better in the metal film's adhesion to the sealing resin and in the electromagnetic wave shielding performance. In contrast, Sample #19 (Example 16) whose first metal film was 0.3 μm in thickness was assessed as "B" in the EMI test. Moreover, Sample #23 (Example 20) whose first metal film was 3.7 μm in thickness was assessed as "2" in the cross-cut test.

Samples #24 to #28 (Examples 21 to 25) of the electronic component modules were prepared; Samples #24 to #28 had the same configuration as that of Example 1 except that the first metal films were an alloy film made of Cu and Ni, and the

TABLE 6

| SAMPLE | Oxide particles in the sealing resin | | Metal film on a surface opposed to the mounting surface | | | Evaluation | | | |
|---|---|---|---|---|---|---|---|---|---|
| | Crack (Crack Depth) | Metal in the Clack | Cu group | | Ni | Cross cut Test | PCT Test | EMI Test | Judg- ment |
| | | | Composition | Thick- ness | Thick- ness | | | | |
| Example 16 | Y (7.3 μm) | Y | Cu—Ni | 0.3 μm | 2.1 μm | 1 | A | B | B |
| Example 17 | Y (8.9 μm) | Y | Cu—Ni | 0.5 μm | 2.0 μm | 1 | A | A | A |
| Example 18 | Y (6.1 μm) | Y | Cu—Ni | 2.1 μm | 1.9 μm | 1 | A | A | A |
| Example 19 | Y (7.5 μm) | Y | Cu—Ni | 3.5 μm | 1.9 μm | 1 | A | A | A |
| Example 20 | Y (9.0 μm) | Y | Cu—Ni | 3.7 μm | 2.0 μm | 2 | A | A | B |

*[Y]: Presence, [N]: Absence

As can be seen from Table 6, it was found that Samples #20 to #22 (Examples 17 to 19) whose first metal films were an alloy film made of Cu and Ni and were 0.5 μm to 3.5 μm in Ni films (second metal films) were different in thickness. The samples were assessed in the same way as in Example 1. Table 7 shows the results.

TABLE 7

| SAMPLE | Oxide particles in the sealing resin | | Metal film on a surface opposed to the mounting surface | | | Evaluation | | | |
|---|---|---|---|---|---|---|---|---|---|
| | Crack (Crack Depth) | Metal in the Clack | Cu group | | Ni | Cross cut Test | PCT Test | EMI Test | Judg- ment |
| | | | Compo- sition | Thick- ness | Thick- ness | | | | |
| Example 21 | Y (9.3 μm) | Y | Cu—Ni | 2.0 μm | 0.3 μm | 1 | B | A | B |

TABLE 7-continued

| SAMPLE | Oxide particles in the sealing resin Crack (Crack Depth) | Metal in the Clack | Metal film on a surface opposed to the mounting surface Cu group Composition | Thickness | Ni Thickness | Evaluation Cross cut Test | PCT Test | EMI Test | Judgment |
|---|---|---|---|---|---|---|---|---|---|
| Example 22 | Y (8.8 μm) | Y | Cu—Ni | 1.9 μm | 0.5 μm | 1 | A | A | A |
| Example 23 | Y (8.1 μm) | Y | Cu—Ni | 2.0 μm | 1.9 μm | 1 | A | A | A |
| Example 24 | Y (8.2 μm) | Y | Cu—Ni | 9.0 μm | 3.0 μm | 1 | A | A | A |
| Example 25 | Y (10.0 μm) | Y | Cu—Ni | 2.1 μm | 3.2 μm | 2 | A | A | B |

*[Y]: Presence, [N]: Absence

As can be seen from Table 7, it was found that Samples #25 to #27 (Examples 22 to 24) whose Ni films were 0.5 μm to 3.0 μm in thickness were better in the durability (PCT resistance) and the electromagnetic wave shielding performance. In contrast, Sample #24 (Example 21) whose Ni film was 0.3 μm in thickness was assessed as "B" in the PCT test. Sample #28 (Example 25) whose Ni film was 3.2 μm in thickness was assessed as "2" in the cross-cut test.

Samples #26 and #29 to #32 (Examples 23, 26 to 29) of the electronic component modules were prepared: In the samples, the first metal films were an alloy film made of Cu and Ni, and the ratio in thickness of the upper surface portion of the metal film that covers the upper surface of the sealing resin to the side surface portion of the metal film that covers the side surface of the sealing resin was different between the samples. The samples were assessed in the same way as in Example 1. Table 8 shows the results.

TABLE 8

| SAMPLE | Metal film thickness (Cu alloy film + Ni film) Upper surface (X) | Side surface (Y) | X/Y | Metal film thickness Upper surface Cu—Ni | | Side surface Cu—Ni | | Evaluation Cross cut Test | PCT Test | EMI Test | Judgment |
|---|---|---|---|---|---|---|---|---|---|---|---|
| Example 26 | 3.8 μm | 4.8 μm | 0.8 | 1.9 μm | 1.9 μm | 2.4 μm | 2.4 μm | 1 | B | A | B |
| Example 27 | 4.1 μm | 4.0 μm | 1.0 | 2.0 μm | 2.1 μm | 2.0 μm | 2.0 μm | 1 | A | A | A |
| Example 23 | 3.9 μm | 1.9 μm | 2.1 | 2.0 μm | 1.9 μm | 0.9 μm | 1.0 μm | 1 | A | A | A |
| Example 28 | 4.3 μm | 1.7 μm | 2.5 | 2.2 μm | 2.1 μm | 0.9 μm | 0.8 μm | 1 | A | A | A |
| Example 29 | 4.2 μm | 1.3 μm | 3.2 | 2.2 μm | 2.0 μm | 0.7 μm | 0.6 μm | 1 | B | A | B |

*Upper surface is opposed to the mounting surface.
*Side surface is perpendicular to the mounting surface.

As can be seen from Table 8, it was found that Samples #26, #30, and #31 (Examples 23, 27, and 28) in which the ratio X/Y of the thickness X of the upper surface portion of the metal film to the thickness Y of the side surface portion of the metal film was 1.0 to 2.5 were better in the durability (PCT resistance). In contrast, Sample #29 (Example 26) in which the thickness ratio X/Y was 0.8 was assessed as "B" in the PCT test. Moreover, Sample #32 (Example 29) in which the thickness ratio X/Y was 3.2 was assessed as "B" in the PCT test.

What is claimed is:
1. An electronic component module comprising:
an electronic component;
a sealing resin that seals the electronic component; and
a metal film that covers a surface of the sealing resin, wherein
the sealing resin contains a filler of oxide particles,
a part of the filler in the sealing resin is exposed to the surface of the sealing resin,
at least the part of the filler exposed to the surface of the sealing resin includes a crack that extends from an exposed surface of the filler into an inner portion,
the crack is filled with at least one metal that constitutes the metal film, and
the exposed surface of the filler is substantially flush with a surface of the sealing resin.

2. The electronic component module as claimed in claim 1, wherein
the metal film includes a first metal film that is formed on a surface of the sealing resin and is made mainly of Cu, and a second metal film that is formed on a surface of the first metal film and is made mainly of Ni, and the crack is filled with part of the first metal film.

3. The electronic component module as claimed in claim 2, wherein the first metal film further contains at least one metal that is selected from among a group of Ni, Co, and Fe.

4. The electronic component module as claimed in claim 2, wherein the first metal film is 0.5 μm to 3.5 μm in thickness.

5. The electronic component module as claimed in claim 2, wherein the second metal film is 0.5 μm to 3.0 μm in thickness.

6. The electronic component module as claimed in claim 1, wherein a ratio in thickness of an upper surface portion of the metal film that covers an upper surface of the sealing resin to a side surface portion of the metal film that covers a side surface of the sealing resin is greater than or equal to 1.0 and less than or equal to 2.5.

\* \* \* \* \*